(12) United States Patent
Avanzino et al.

(10) Patent No.: US 8,445,913 B2
(45) Date of Patent: May 21, 2013

(54) METAL-INSULATOR-METAL (MIM) DEVICE AND METHOD OF FORMATION THEREOF

(75) Inventors: Steven Avanzino, Cupertino, CA (US); Tzu-Ning Fang, Palo Alto, CA (US); Swaroop Kaza, Sunnyvale, CA (US); Dongxiang Liao, Sunnyvale, CA (US); Wai Lo, Palo Alto, CA (US); Christie Marrian, San Jose, CA (US); Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 195 days.

(21) Appl. No.: 11/980,213

(22) Filed: Oct. 30, 2007

(65) Prior Publication Data

US 2009/0109598 A1    Apr. 30, 2009

(51) Int. Cl.
*H01L 29/12* (2006.01)

(52) U.S. Cl.
USPC .............. 257/71; 257/296; 257/E27.048

(58) Field of Classification Search
USPC ..... 257/68, 71, 277, 296, 751, 753, 758–760, 257/297, 298, 306, 311, 532, E29.343, 382, 257/773–775, E29.119, 300, 310, E21.643
See application file for complete search history.

(56) References Cited

U.S. PATENT DOCUMENTS

| | | | | |
|---|---|---|---|---|
| 5,708,559 A * | 1/1998 | Brabazon et al. | ............. | 361/313 |
| 5,952,687 A * | 9/1999 | Kawakubo et al. | ............ | 257/296 |
| 5,953,609 A * | 9/1999 | Koyama et al. | ................ | 438/253 |
| 5,963,818 A * | 10/1999 | Kao et al. | ........................ | 438/424 |
| 6,204,070 B1 * | 3/2001 | Kim | ................................... | 438/3 |
| 6,337,238 B1 * | 1/2002 | Nakabayashi | ................. | 438/240 |
| 6,355,492 B1 * | 3/2002 | Tanaka et al. | ...................... | 438/3 |
| 6,388,285 B1 * | 5/2002 | Black et al. | .................... | 257/315 |
| 6,821,862 B2 * | 11/2004 | Cho | ............................... | 438/396 |
| 6,979,847 B2 * | 12/2005 | Mitsuhashi | .................... | 257/295 |
| 7,075,135 B2 * | 7/2006 | Cross et al. | .................... | 257/295 |
| 7,098,497 B2 * | 8/2006 | Fukuzumi | ...................... | 257/296 |
| 7,109,540 B2 * | 9/2006 | Higuchi | ........................ | 257/295 |
| 7,180,117 B2 * | 2/2007 | Won | .............................. | 257/306 |
| 7,208,791 B2 * | 4/2007 | Oh et al. | ....................... | 257/306 |
| 7,220,600 B2 * | 5/2007 | Summerfelt et al. | ............. | 438/3 |
| 7,476,584 B2 * | 1/2009 | Park | ............................... | 438/233 |
| 7,485,915 B2 * | 2/2009 | Nasu et al. | .................... | 257/310 |
| 7,528,405 B2 * | 5/2009 | Rinerson et al. | ................ | 257/41 |

(Continued)

FOREIGN PATENT DOCUMENTS

WO    WO 2006/131968 A1 * 12/2006

OTHER PUBLICATIONS

Webster's New World College Dictionary, Fourth Edition, pp. 1007.*

(Continued)

*Primary Examiner* — Matthew Landau
*Assistant Examiner* — Joseph C Nicely

(57) ABSTRACT

In a method of fabricating a metal-insulator-metal (MIM) device, initially, a first electrode is provided. An oxide layer is provided on the first electrode, and a protective layer is provided on the oxide layer. An opening through the protective layer is provided to expose a portion of the oxide layer, and a portion of the first electrode underlying the exposed portion of the oxide layer is oxidized. A second electrode is provided in contact with the exposed portion of the oxide layer. In alternative embodiments, the initially provided oxide layer may be eliminated, and spacers of insulating material may be provided in the opening.

11 Claims, 13 Drawing Sheets

U.S. PATENT DOCUMENTS

| | | | |
|---|---|---|---|
| 7,557,038 B2 * | 7/2009 | Hwang | 438/672 |
| 7,608,510 B2 * | 10/2009 | Moens et al. | 438/268 |
| 2002/0014646 A1 * | 2/2002 | Tsu et al. | 257/296 |
| 2002/0100924 A1 * | 8/2002 | Rhodes | 257/256 |
| 2002/0127867 A1 * | 9/2002 | Lee | 438/694 |
| 2002/0192979 A1 * | 12/2002 | Ahn et al. | 438/772 |
| 2004/0023416 A1 * | 2/2004 | Gilbert et al. | 438/3 |
| 2004/0056324 A1 * | 3/2004 | Ning et al. | 257/528 |
| 2004/0102014 A1 * | 5/2004 | Ning et al. | 438/393 |
| 2004/0113232 A1 * | 6/2004 | Johnson et al. | 257/529 |
| 2005/0073803 A1 * | 4/2005 | Cho | 361/306.1 |
| 2005/0106761 A1 * | 5/2005 | Lee et al. | 438/3 |
| 2005/0142862 A1 * | 6/2005 | Chun | 438/639 |
| 2005/0170648 A1 * | 8/2005 | Tsai et al. | 438/687 |
| 2006/0261387 A1 * | 11/2006 | Izumi | 257/295 |
| 2007/0176243 A1 * | 8/2007 | Watanabe | 257/379 |
| 2008/0081380 A1 * | 4/2008 | Celii et al. | 438/3 |
| 2008/0142860 A1 * | 6/2008 | Chen et al. | 257/296 |
| 2008/0151598 A1 * | 6/2008 | Madan | 365/145 |
| 2008/0157071 A1 * | 7/2008 | Ahn et al. | 257/40 |
| 2008/0174017 A1 * | 7/2008 | Yang et al. | 257/751 |
| 2008/0272357 A1 * | 11/2008 | Horii et al. | 257/3 |
| 2010/0019804 A1 * | 1/2010 | Jung et al. | 327/52 |
| 2010/0047931 A1 * | 2/2010 | Nagai | 438/3 |
| 2011/0012230 A1 * | 1/2011 | Izumi et al. | 257/532 |

OTHER PUBLICATIONS

Quirk et al. "Semiconductor Manufacturing Technology" Prentice Hall, 2001, pp. 309-310.*

* cited by examiner

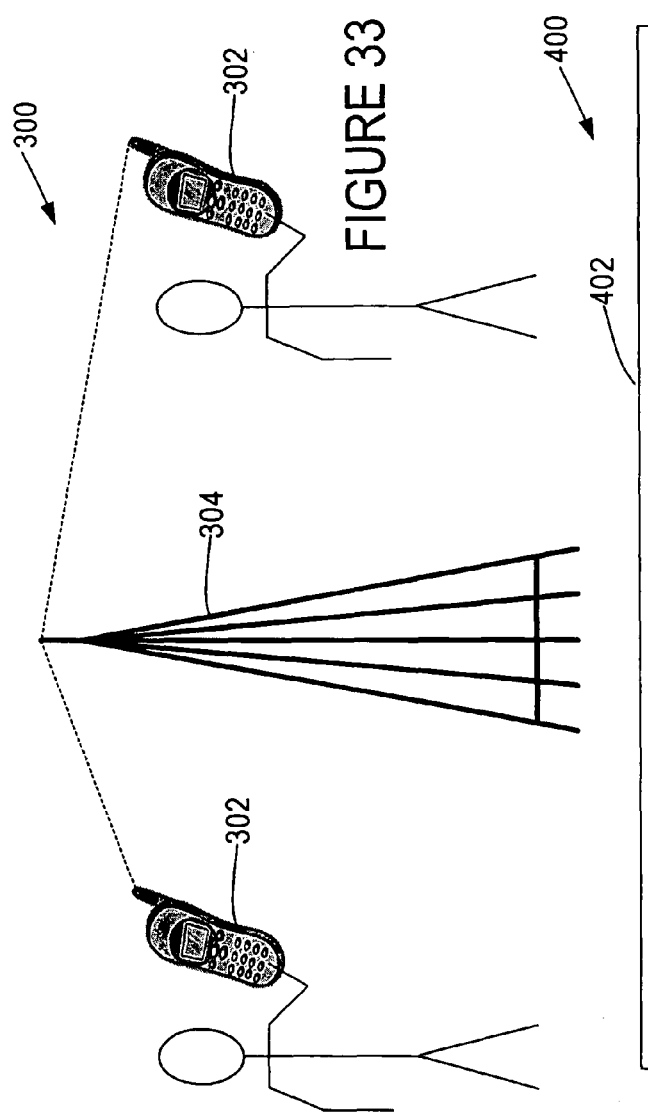
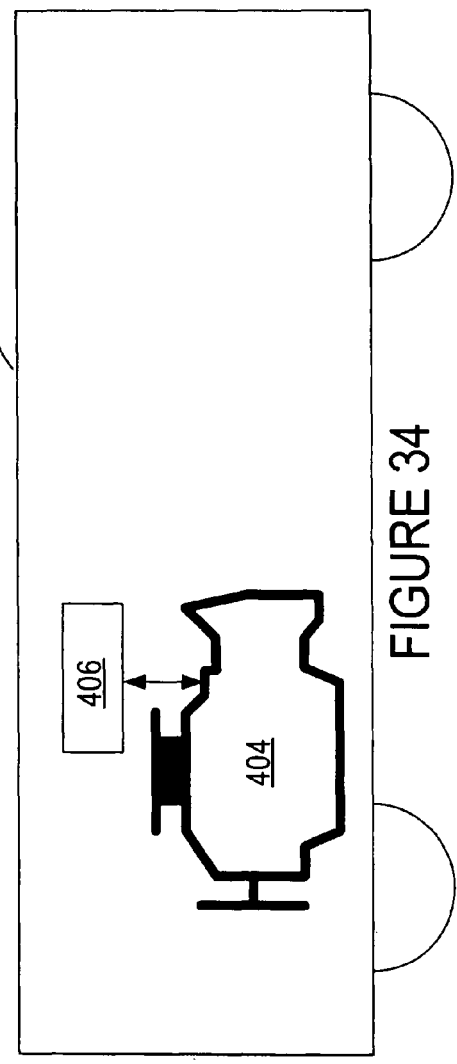

METAL-INSULATOR-METAL (MIM) DEVICE AND METHOD OF FORMATION THEREOF

BACKGROUND OF THE INVENTION

1. Technical Field

This invention relates generally to memory devices, and more particularly, to Metal-Insulator-Metal (MIM) devices and methods of fabrication thereof.

2. Background Art

FIGS. 1 and 2 illustrate a method of fabricating a Metal-Insulator-Metal (MIM) device using etching techniques. Initially, conductive layer 22 is provided on a substrate 20. Next, an insulating layer 24 is provided on the conductive layer 22. Then, another conductive layer 26 is provided on the insulating layer 24. It will be understood that the conductive layers 22, 26 and insulating layer 24 may be of a variety of materials. (It is further understood that the term "MIM" is used to describe such a device even though, for example, the top and/or bottom layers 22, 26 may be nonmetallic). Next, a photoresist layer 28 is provided over the conductive layer 26 and, using standard photolithographic techniques, the photoresist layer 28 is patterned as shown. Using the patterned photoresist layer 28 as a mask, the exposed material is etched away to remove portions of the conductive layer 22, insulating layer 24, and conductive layer 26, to form the remaining MIM stack 30 on the substrate 20. The photoresist 28 is then removed, resulting in the MIM device 30 including electrode 22A, insulating layer 24A, and electrode 26A formed on the substrate 20.

It will be understood that the device stack must be properly formed to ensure proper operation of the device 30. For example, it is highly desirable that the etchant provide proper, even etching of the materials of the electrodes 22, 26 and insulating layer 24, meanwhile leaving the exposed material of the substrate 20 substantially intact (the "selectivity" of the etchant refers to the ability to properly remove selected material while leaving other material in contact therewith substantially intact). While the MIM device 30 of FIG. 2 is shown as ideally formed, it has occurred that, depending on the materials selected for the electrodes 22, 26 and insulating layer 24, and the etchant used, uneven etching of the materials of the layers 22, 24, 26 can take place, resulting in improper formation of the MIM stack 30 (for example one layer may etch more rapidly than the other layers, resulting in a larger amount of that layer being etched away than the other layers (FIG. 3). In addition, undesirable gouging of the substrate 20 and layers 22, 24, 26 may take place. These phenomena cause degradation in performance in the resulting memory device.

In addition the above described approach has limited scaleability, resulting in less efficient manufacturing approaches.

Therefore, what is needed is an approach which avoids the above-cited problems, providing a properly and consistently formed MIM device with improved scaleability.

DISCLOSURE OF THE INVENTION

Broadly stated, the present invention is a method of fabricating a metal-insulator-metal (MIM) device comprising providing a first electrode, providing an oxide layer on the first electrode, providing a protective layer on the oxide layer, providing an opening through the protective layer to expose a portion of the oxide layer, oxidizing a portion of the first electrode underlying the exposed portion of the oxide layer, and providing a second electrode in contact with the exposed portion of the oxide layer.

Broadly stated, another form of the invention is metal-insulator-metal (MIM) device comprising a first electrode, an oxide layer on the first electrode, a protective layer on the oxide layer and having an opening therethrough, a spacer of insulating material on a wall of the opening in the protective layer, and a second electrode in contact with the insulating layer and spacer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 33-35 illustrate systems incorporating the invention.

BEST MODE(S) FOR CARRYING OUT THE INVENTION

Reference is now made in detail to specific embodiments of the present invention which illustrate the best mode presently contemplated by the inventors for practicing the invention.

Figure 1:
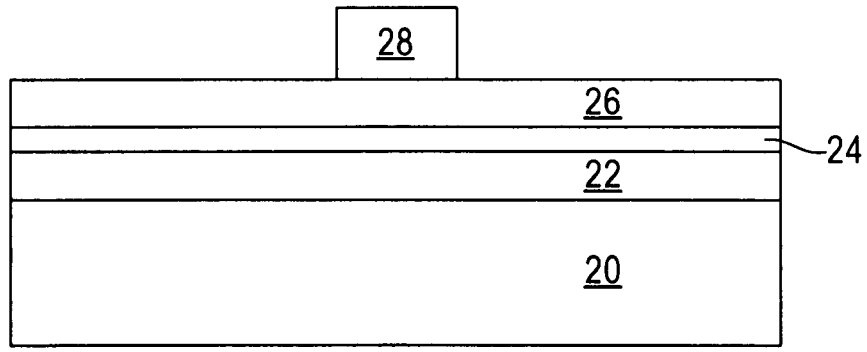
FIGS. 1-3 illustrate process steps in the formation of a MIM in accordance with a method of the prior art.
Figure 2:
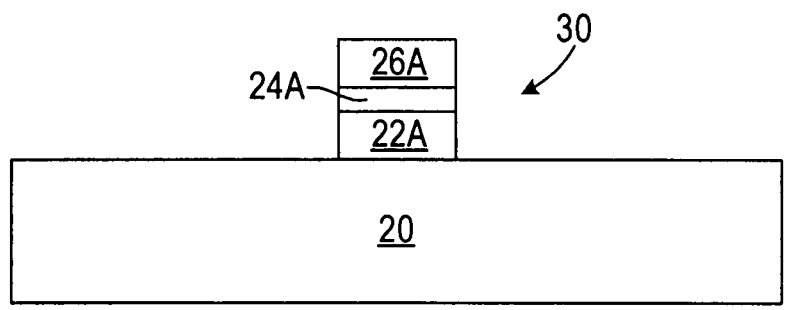
Figure 3:
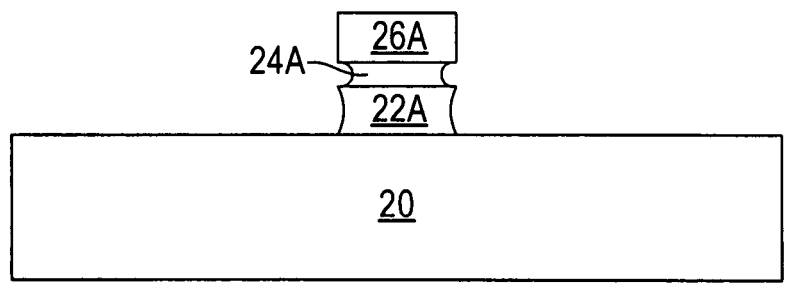
Figure 4:
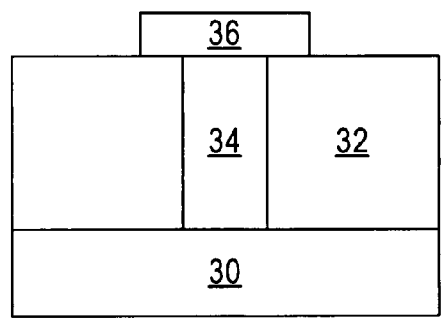
FIGS. 4-10 illustrate process steps in the formation of a first embodiment of MIM device in accordance with the present invention.

The fabrication of a first particular embodiment of MIM, i.e. a Ta-TaN electrode/Ta oxide/Al(0.5% Cu)/TiN electrode memory device MIM will now be described with reference to FIGS. 4-10. After formation of a conductive layer 30, a dielectric substrate 32 thereon and an interconnect conductive plug 34 (for example Cu or W) in a via in the substrate 32 contacting the conductive layer 30, sequential processing steps are undertaken in a multi-chamber PVD system such as the Applied Materials Endura system, without vacuum break. Initially, degassing is undertaken at 150° C., and Ar+ion sputter etch is undertaken to remove native metal oxide from the exposed plug 34 surface. β-Ta is deposited on the substrate 32 and plug 34, to a thickness of 50-150 angstroms, at 200° C., and fcc TaN is deposited on the β-Ta to a thickness of 150-350 angstroms, also at 200° C. (The material of the bottom electrode is Ta or TaN, or combinations thereof. Such electrodes have been constructed using 1) α-Ta (Ta deposited onto a TaN seed layer), 2) pure fcc TaN, and bilayer fcc TaN over β-Ta). Next, the bilayer Ta-TaN film is patterned by photolithography, and the exposed bilayer Ta-TaN film is etched away in an RIE etcher such as the Lam 9600, using a Cl-containing metal etch chemistry well known to those skilled in the art, to form bottom electrode 36 (FIG. 4). Photoresist is removed by a combination of mild $O_2$ plasma and wet solvent techniques.

Figure 5:
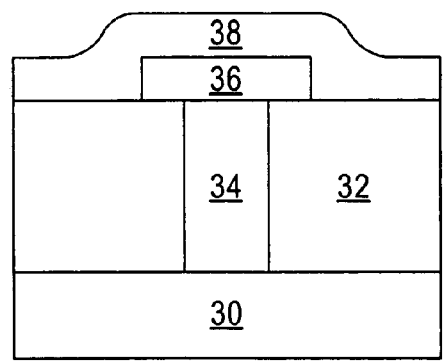

In the next step, the bottom electrode 36 has provided thereon and is encapsulated in protective dielectric layer 38 using a plasma CVD reactor (FIG. 5). First a 300-1000 angstrom thick layer of plasma silicon nitride (SiN) is deposited from $SiH_4$, $NH_3$, and $N_2$ at 350° C.-400° C. in an RF-plasma enhanced deposition tool, such as the AMAT Producer or Novellus Concept 2 Sequel. Then as an antireflective coating, a 300-600 angstroms thick layer of plasma silicon oxynitride (SiON) is deposited from $SiH_4$, $N_2O$, & $N_2$ at 350° C.-400° C.

Figure 6:
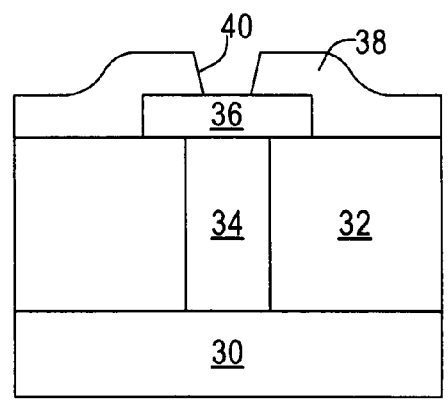
Figure 7:
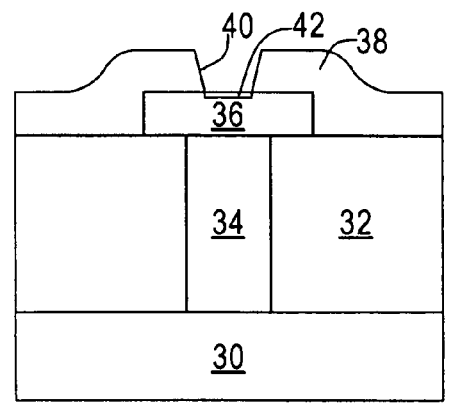

Photolithography is carried out on the formed protective dielectric layer 38 to pattern a contact opening 40 of 0.1-0.3 μm diameter on top of the bottom electrode 36 (FIG. 6). Care is taken to position the opening 40 so that it is landed on and exposes a planar and smooth portion of the bottom electrode 36. The contact opening 40 is etched through the dielectric layer 38 in an RIE etch tool such as the TEL DRM etcher, using $CHF_3$, $O_2$ chemistry. The etching of layer 38 is initiated through a photoresist mask in place, then the mask is removed with $O_2$ plasma, and the dielectric etching is completed. This is done to prevent metal re-sputter defects and to slope the opening sidewalls.

In the next step (FIG. 7), the device is transferred to an oxidation chamber to oxidize a portion of the electrode, growing $Ta_2O_5$ layer 42 on the exposed surface of the electrode 36 defined by opening 40. Oxidation can be accomplished by any number of means, including thermal oxidation by $O_2$ at elevated temperatures (500° C.-800° C.), and reduced-pressure oxidation in an O-containing plasma at somewhat lower temperatures. In the present embodiment we use an $O_2$ plasma established in a Gasonics photoresist asher, where the device is downstream of the glow discharge. The machine conditions used are 1) 250° C.-300° C. device temperature, 2) 800-1400 W RF power, 3) 1200-2500 sccm $O_2$ flow, 4) 0.8-1.6 Torr pressure, 5) 5-30 min process time. These conditions are typical but not exclusive. The process grows ~6-15 nm tantalum oxide layer 42 with a gross stoichiometry of $Ta_2O_5$. The film is amorphous, with roughness of <10 Å rms.

Figure 8:
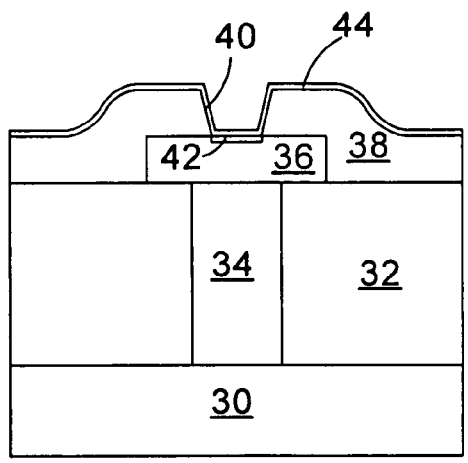
Figure 9:
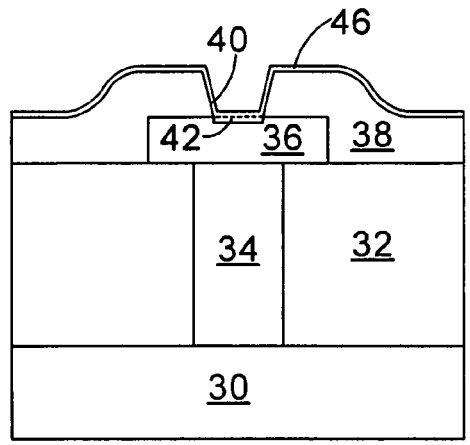

Next, using appropriate masking and etching techniques, a 25-50 angstrom thick layer 44 of Ta is deposited by PVD onto the resulting structure, i.e., over the layer 38 and the oxide layer 42 (FIG. 8). The thin Ta layer 44 is oxidizable and is then completely reacted to $Ta_2O_5$ layer 46 by another oxidation process similar to that described above (FIG. 9). The two-step oxidation can produce a resulting layered Ta oxide (including oxide layer 42 and the portion of oxide layer 46 thereon and in contact therewith) of ~12 nm-20 nm thickness. Alternatively, in lieu of carrying out an oxidation of metallic Ta, a 50-100 angstrom thick layer of $Ta_2O_5$ can be directly deposited by reactive-sputter PVD from a Ta target in an $O_2$/Ar ambient. In some cells a thick Ta oxide was reduced in thickness by Ar+ion sputter etching, which tends to produce a Ta-rich layer on the sputtered surface of the oxide. In other cells the Ta oxide was partially reduced by the chemical interaction with a reactive metal such as Al during a thermal annealing step. In these cells a layered oxide structure of Al oxide and Ta oxide was produced, with a Ta-rich layer sandwiched in between. These effects were devised to influence the electrical characteristics of the cells.

Cells were fabricated with a range in final $Ta_2O_5$ thickness by combining the above techniques and modifying the duration of the oxidation processes.

Figure 10:
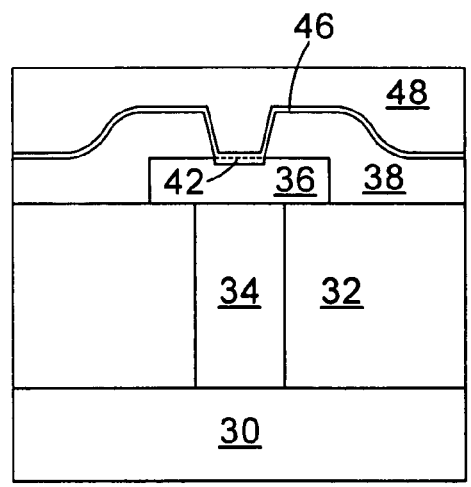

The device is then transferred back into the PVD deposition system described above, and a top electrode 48 of Al(0.5% Cu) followed by TiN is deposited, in contact with the portion of the oxidized layer 46 on the oxide layer 42 (FIG. 10). In the PVD system the device sequences through degas, followed by 750-4000 angstrom thick deposition of Al(0.5% Cu) at a temperature of 150° C., plus 750-1000 angstroms of TiN at 150° C. Low RF power settings (≦5 kW) were used during processing to better control the deposition rate and reduce sputter damage to the metal oxide insulator.

Next, the electrode 48 is patterned by photolithography to create the M2 conductor/top electrode layer contacting oxide 46 and extending above the protective layer 38. The TiN/Al is RIE etched using Cl-containing chemistry in a tool such as the Lam 9600.

Figure 11:
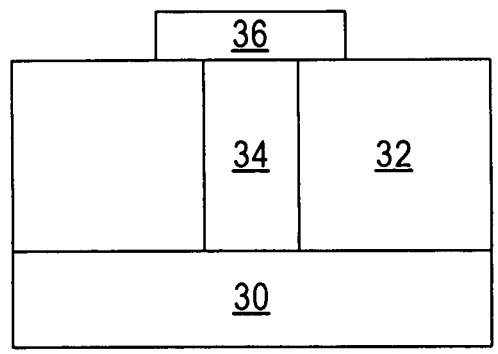
FIGS. 11-16 illustrate process steps in the formation of a second embodiment of MIM device in accordance with the present invention.
Figure 12:
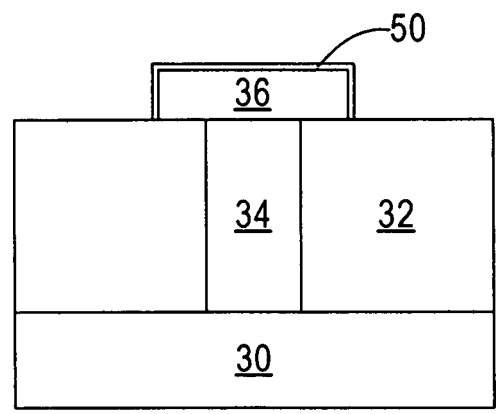
Figure 13:
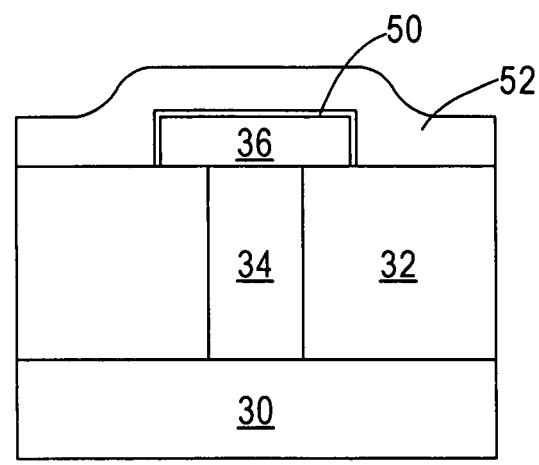
Figure 14:
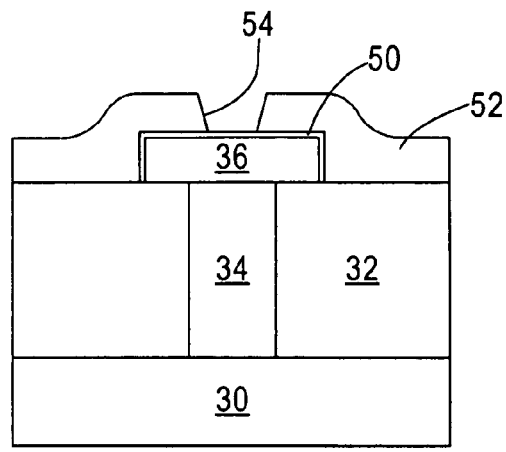
Figure 15:
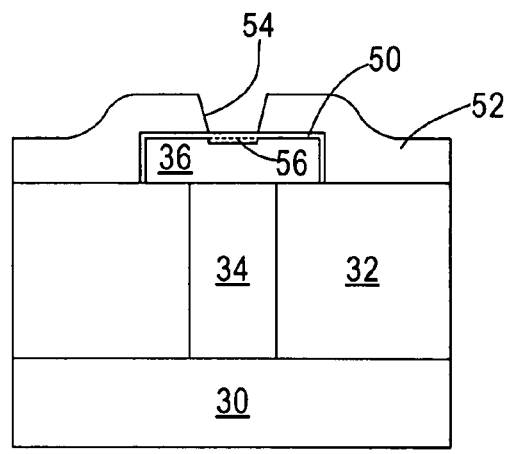
Figure 16:
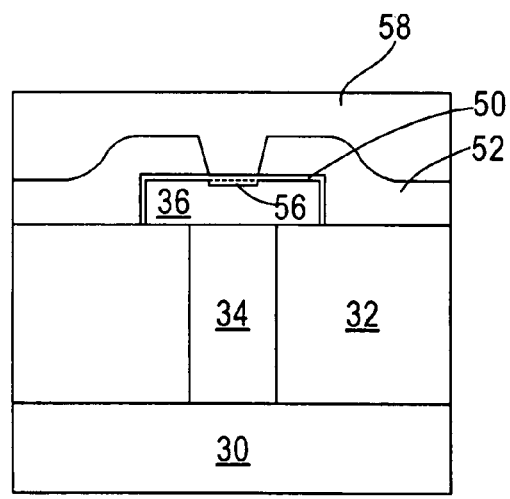

FIGS. 11-16 illustrate a second embodiment of the invention. Referring to FIG. 11, the bottom electrode 36 is formed on the substrate 32 and plug 34 as previously described with reference to FIG. 4. Next (FIG. 12), an oxide layer 50 is grown on the entire exposed surface of the electrode 36 in a downstream $O_2$ plasma at temperatures ranging from 250° C.-300° C. In the case of the oxidation of TaN, some nitrogen was incorporated into the Ta oxide, segregated mostly at the interface with the TaN. The thickness of the grown Ta oxide 50 ranged from ~60 angstroms- ~150 angstroms, with a thickness uniformity within 20%. The formed oxide 50 is principally amorphous Ta oxide with a stoichiometry approximated by $Ta_2O_5$.

Next (FIG. 13), a protective layer 52 is formed as shown and described with regard to FIG. 5, and (FIG. 14) an opening 54 is provided therein to expose a portion of the oxide layer 50, using steps similar to those shown and described with regard to FIG. 6. Next, another oxidation step is undertaken (FIG. 15), using the procedures shown and described with regard to FIG. 7, to oxidize a portion 56 of the electrode 36 underlying the exposed portion of the oxide layer the. The top electrode 58 is then formed (FIG. 16) as previously described with regard to FIG. 10.

Figure 17:
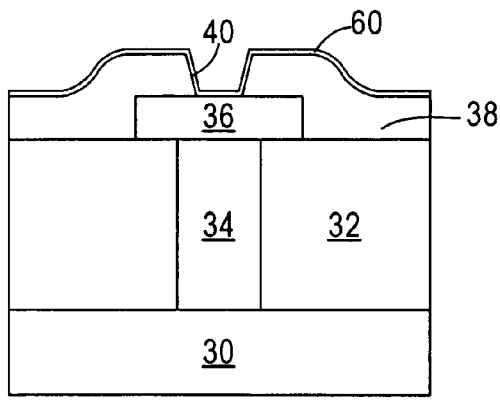
FIGS. 17-20 illustrate process steps in the formation of a third embodiment of MIM device in accordance with the present invention.
Figure 18:
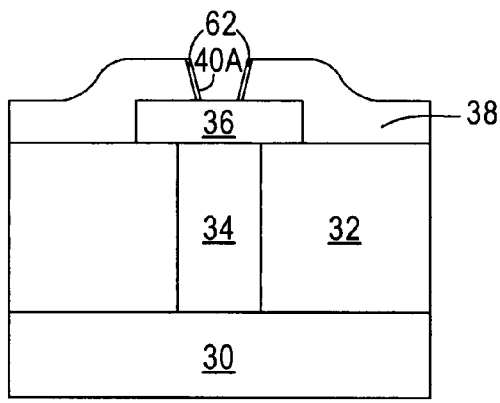
Figure 19:
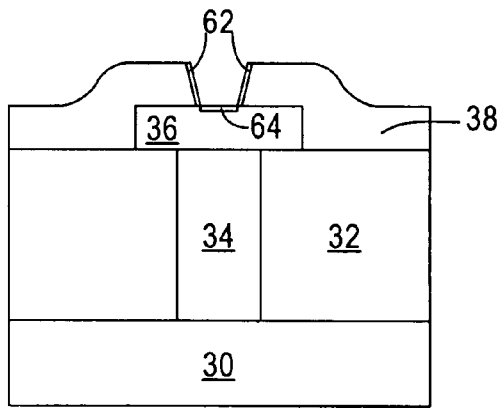
Figure 20:
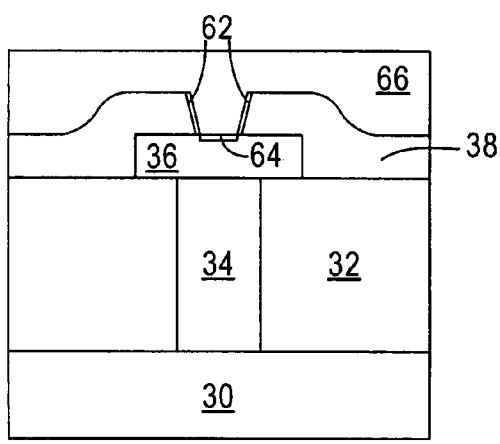
Figure 21:
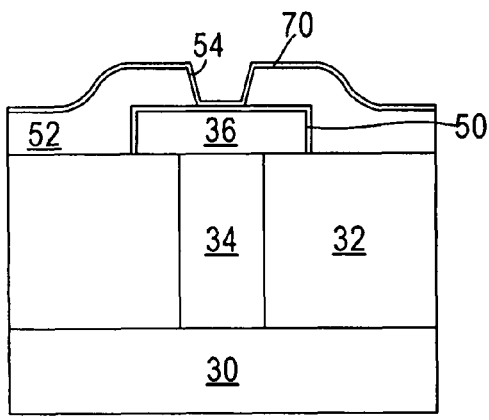
FIGS. 21-24 illustrate process steps in the formation of a fourth embodiment of MIM device in accordance with the present invention.
Figure 22:
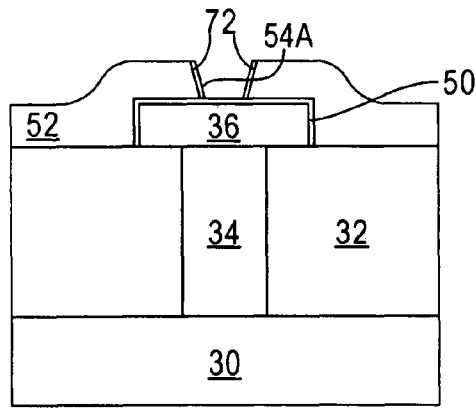
Figure 23:
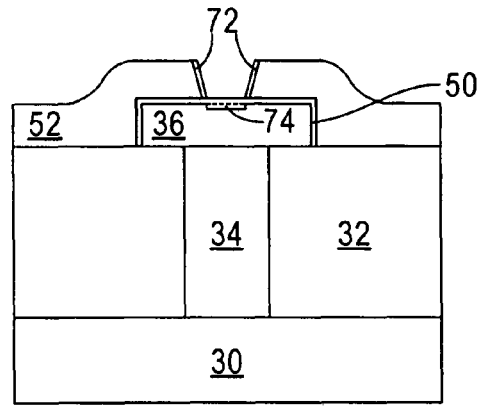
Figure 24:
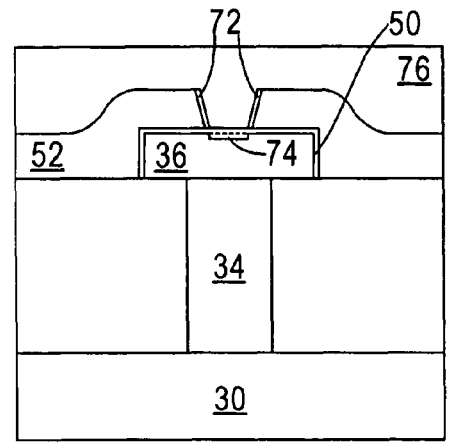

In a third embodiment of the invention, process steps as shown and described with regard to FIGS. 4-6 are initially undertaken. Then (FIG. 17) a silicon nitride (SiN) layer 60 is deposited to a thickness of 500-1000 angstroms. This SiN layer 60 is then subjected to an unmasked, anisotropic RIE etchback of an amount slightly exceeding the deposition thickness. The process results in formation of an annular SiN spacer 62 on the walls of the opening 40, reducing the size of the opening 40A to a range of 50-200 nm diameter and reducing the size of the exposed portion of the electrode 36. Metal oxide insulator 64 is grown at the bottom of the opening 40A now defined by the spacer 62 by oxidation of the exposed metal surface of the bottom electrode 36, using processes shown and described above. The top electrode 66 is formed as previously shown and described, in contact with oxide 64 and spacer 62. The cell area is defined by the area at the bottom of the spacer 62, typically ~0.0064 μm².

FIGS. 21-24 illustrate a fourth embodiment of the invention. In this case, process steps as shown and described with regard to FIGS. 11-14 are initially undertaken. Then (FIG. 21) a silicon nitride (SiN) layer 70 is deposited to a thickness of 500-1000 angstroms. This SiN layer 70 is then subjected to an unmasked, anisotropic RIE etchback of an amount slightly exceeding the deposition thickness. The process results in an annular SiN spacer 72 narrowing the contact opening 54A to a range of 50-200 nm diameter. Then an oxidation step is undertaken to oxidize a portion 74 of the electrode 36 underlying the exposed portion of the oxide layer 50, the size of which is determined by the spacer 72. The top electrode 76 is formed as previously shown and described, in contact with oxide 50 and spacer 72.

Figure 25:
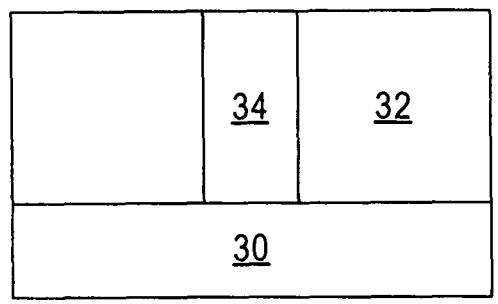
FIGS. 25-30 illustrate process steps in the formation of a fifth embodiment of MIM device in accordance with the present invention.
Figure 26:
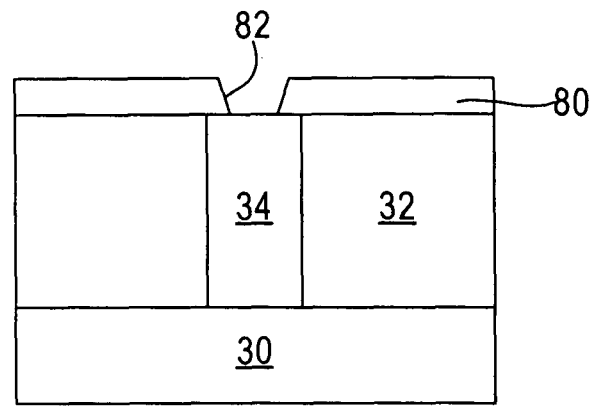
Figure 27:
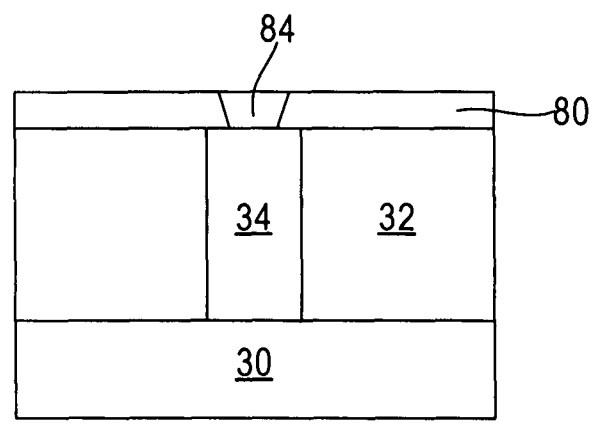
Figure 28:
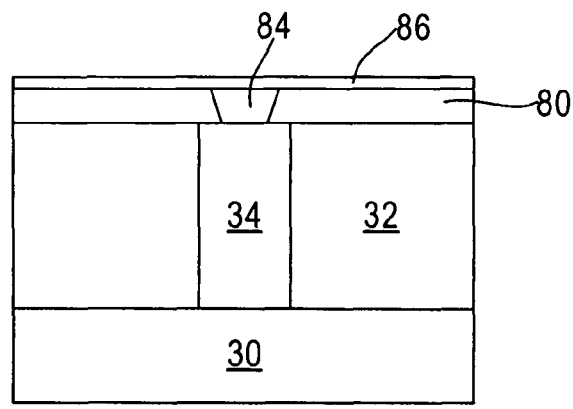
Figure 29:
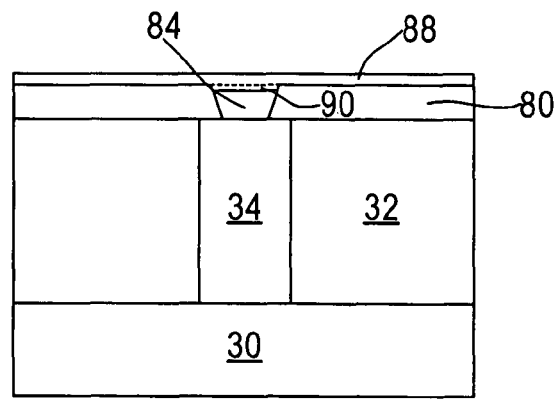
Figure 30:
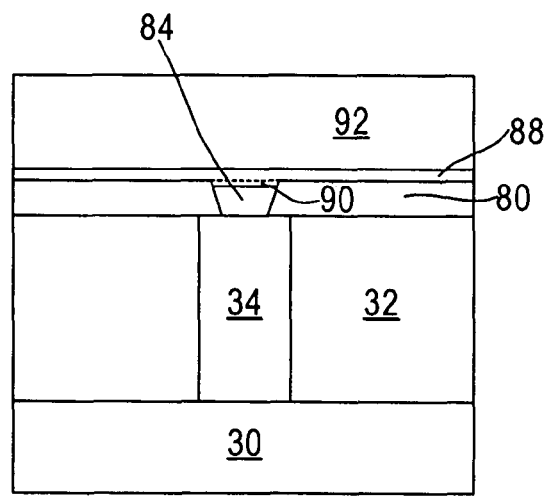

In a fifth embodiment of the invention (FIGS. 25-30), a process will be described for fabricating a Ta/Ta oxide/Ni damascene MIM cell. After metal interconnect plug 34 is formed in substrate 32 to contact the MIM structure (FIG. 25), a bi-layer dielectric layer 80 is deposited. First, a 300-1000 angstrom thick layer of plasma silicon nitride (SiN) is deposited from $SiH_4$, $NH_3$, and $N_2$ at 350-400 C in an RF-plasma enhanced deposition tool, such as the AMAT Producer or Novellus Concept 2 Sequel. There as an antireflective coating, a 300-600 angstrom thick film of plasma silicon oxynitride (SiON) is deposited from $SiH_4$, $N_2O$ & $N_2$ at 350-400 C.

Photolithography is carried out on the dielectric films to pattern via opening 82 of 0.18 μm diameter landing on the plug 34. Opening is etched through the dielectric layer 80 in an RIE etch tool such as the TEL DRM etcher, using $CHF_3$, $O_2$ chemistry. The etching of dielectric 80 is initiated through a photoresist mask, then the mask is removed with $O_2$ plasma, and the dielectric etching is completed. This is done to prevent metal re-sputter defects and to slope the contact sidewalls.

Next, a bottom electrode material consisting of β-Ta is deposited by PVD. During sequential processing steps without vacuum break in a multi-chamber PVD, such as the Applied Materials Endura system, the device is degassed at 150 C, Ar+ion sputter etched to remove native metal oxide from the plug surface, then deposited with 800-2000 angstroms of β-Ta at 200° C.

After filling the damascene opening with β-Ta, the excess metal on the surface is removed is removed by CMP polishing, leaving exposed flat electrode 84 of β-Ta. The CMP is carried out on a precision polisher such as the AMAT Mirra, equipped with optical endpoint detection. Planarization is achieved using a hard urethane pad and a silica-abrasive slurry suitable for Ta polish, such as Hitachi T805-1. In order to control the thickness of the resulting Ta electrode 84, reasonably good selectivity between the Ta and the underlying dielectric 80 is important, as well as a clearly identified Ta polishing endpoint.

Then, a 25-50 angstrom thick layer 86 of β-Ta is deposited to blanket cover the resulting structure. The device is then transferred to an oxidation chamber for conversion of the β-Ta layer 86 to oxide 88 and for oxidation of a portion 90 of the electrode 84. Oxidation can be accomplished by any number of means, including thermal oxidation by $O_2$ at elevated temperatures (500° C.-800° C.), and reduced-pressure oxidation in an O-containing plasma at somewhat lower temperatures. In our embodiment we use an $O_2$ plasma established in a Gasonics photoresist asher, where the device is downstream of the glow discharge. The machine conditions used are 1) 250° C.-300° C. device temperature, 2) 800-1400 W RF power, 3) 1200-2500 sccm $O_2$ flow, 4) 0.8-1.6 Torr pressure, 5) 5-30 min process time. These conditions are typical but not exclusive. The process grows 6-15 nm tantalum oxide 90 with a gross stoichiometry of $Ta_2O_5$. Alternatively, in lieu of carrying out an oxidation of metallic Ta, a 50-100 angstrom thick layer of $Ta_2O_5$ can be directly deposited by reactive-sputter PVD from a Ta target in an $O_2$/Ar ambient.

After oxidation, the device is transferred back into the PVD deposition system described above, and a top electrode 92 of Ni is deposited. In the PVD system the device sequences through degas, followed by 100-500 angstrom thick deposition of Ni at a temperature of 30° C. Low RF power settings (≦5 kW) were used during processing to better control the deposition rate and reduce sputter damage to the metal oxide insulator.

Next, the device is patterned by photolithography to create the M2 conductor/top electrode layer 92. The Ni is RIE etched using Cl-containing chemistry in a tool such as the Lam 9600.

As noted, the device was fabricated used β-Ta as the bottom electrode metal. It is possible to use any conductor material as bottom electrode, as long as the material can be deposited into and fill up the via opening to provide a solid plug after CMP. For example TaN, Co, Ni, Cu, Pt, or conductive metal oxides could be used. Metal filling capacity will depend on deposition technique and via aspect ratio as parameters. The thickness of the β-Ta bottom electrodes ranges from 250 angstroms to 900 angstroms. The metal oxide insulating layer is principally amorphous tantalum oxide with a stoichiometry approximated by $Ta_2O_5$.

The thickness of the grown Ta oxide 90 is 60-150 angstroms in the various cells that were tested. Thickness uniformity is within a range of 20%. The top electrode metal in contact with the metal oxide insulator may be either Ni or Co, although any appropriate top electrode metal could be used. The top electrode metal was deposited at a temperature of 30° C. Low RF power settings were used during processing to better control the deposition rate and reduce sputter damage to the metal oxide insulator.

The present approach provides various processes for forming metal-insulator-metal devices. The various methods are straightforward and efficient in properly forming such devices. In particular, the problems set forth with regard to etching of materials to form devices is avoided. In addition, the present approaches provide for a high degree of scalability of devices.

Figure 31:
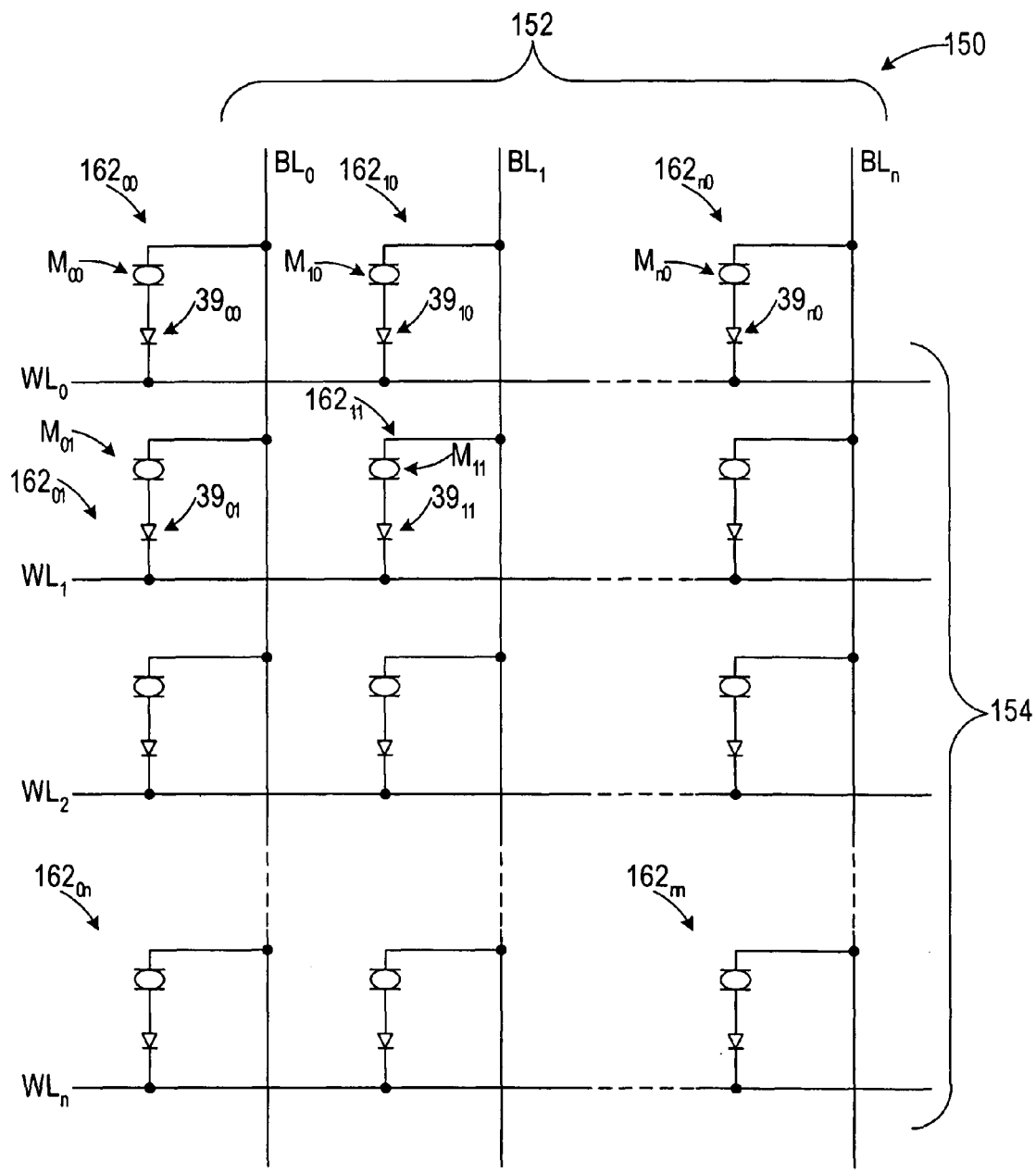
FIGS. 31 and 32 illustrate arrays incorporating the invention.

FIG. 31 illustrates a high density memory device array 150 which incorporates memory devices M as described above (FIGS. 10, 16, 20, 24, 30) and diodes 39. As illustrated in FIG. 31, the memory device array 150 includes a first plurality 152 of parallel conductors (bit lines) $BL_0$, $BL_1$, . . . $BL_n$, and a second plurality 154 of parallel conductors (word lines) $WL_0$, $WL_1$, . . . $WL_n$ overlying and spaced from, orthogonal to, and crossing the first plurality of conductors 152. A plurality of memory devices M are included, each in series with a diode 39, to form a memory device-diode structure 162 which connects a bit line with a word line at the intersection thereof, with the diode in a forward direction from the bit line to the word line. Each memory device-diode structure 162 may be manufactured as a stacked structure, so that efficient manufacturing thereof is achieved.

Figure 32:
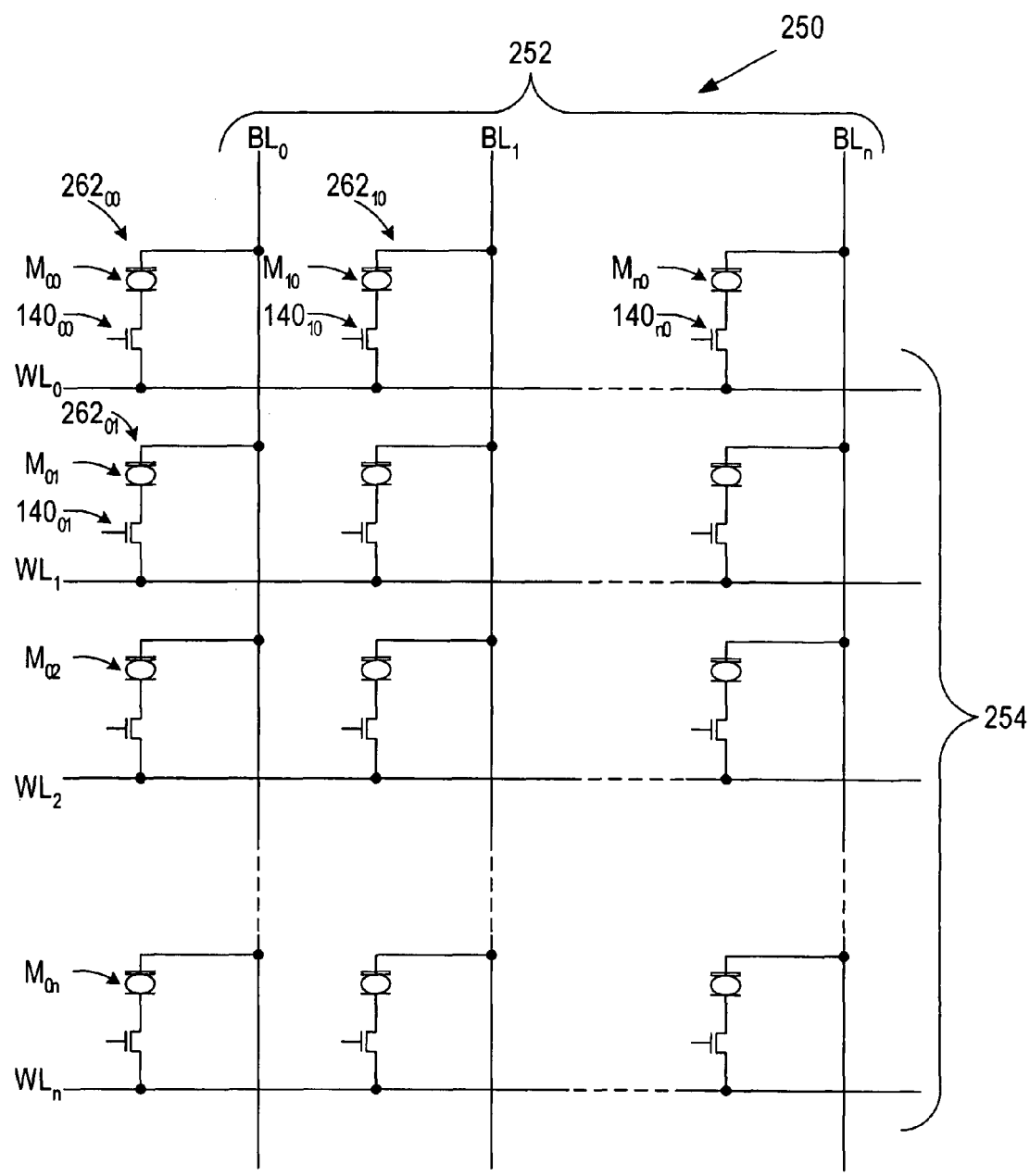

FIG. 32 illustrates a high density memory device array 250 which incorporates memory devices M as described above and transistors 140. As illustrated in FIG. 32, the memory device array 250 includes a first plurality 252 of parallel conductors (bit lines) $BL_0$, $BL_1$, . . . $BL_n$, and a second plurality 254 of parallel conductors (word lines) $WL_0$, $WL_1$, . . . $WL_n$ overlying and spaced from, orthogonal to, and crossing the first plurality of conductors 252. A plurality of memory devices M are included, each in series with a transistor 140, to form a memory device-transistor structure 262 which connects a bit line with a word line at the intersection thereof. The transistors 140 act as select devices for the associated memory devices M.

FIG. 33 illustrates a system 300 utilizing devices as described above. As shown therein, the system 300 includes hand-held devices 302 in the form of cell phones, which communicate through an intermediate apparatus such as a tower 304 (shown) and/or a satellite. Signals are provided from one cell phone to the other through the tower 304. Such a cell phone with advantage uses devices of the type described above. One skilled in the art will readily understand the advantage of using such devices in other hand-held devices 302 such as portable media players, personal digital assistants, digital cameras and the like.

FIG. 34 illustrates another system 400 utilizing devices as described above. The system 400 includes a vehicle 402 having an engine 404 controlled by an electronic control unit 406. The electronic control unit 406 with advantage uses devices of the type described.

Figure 35:
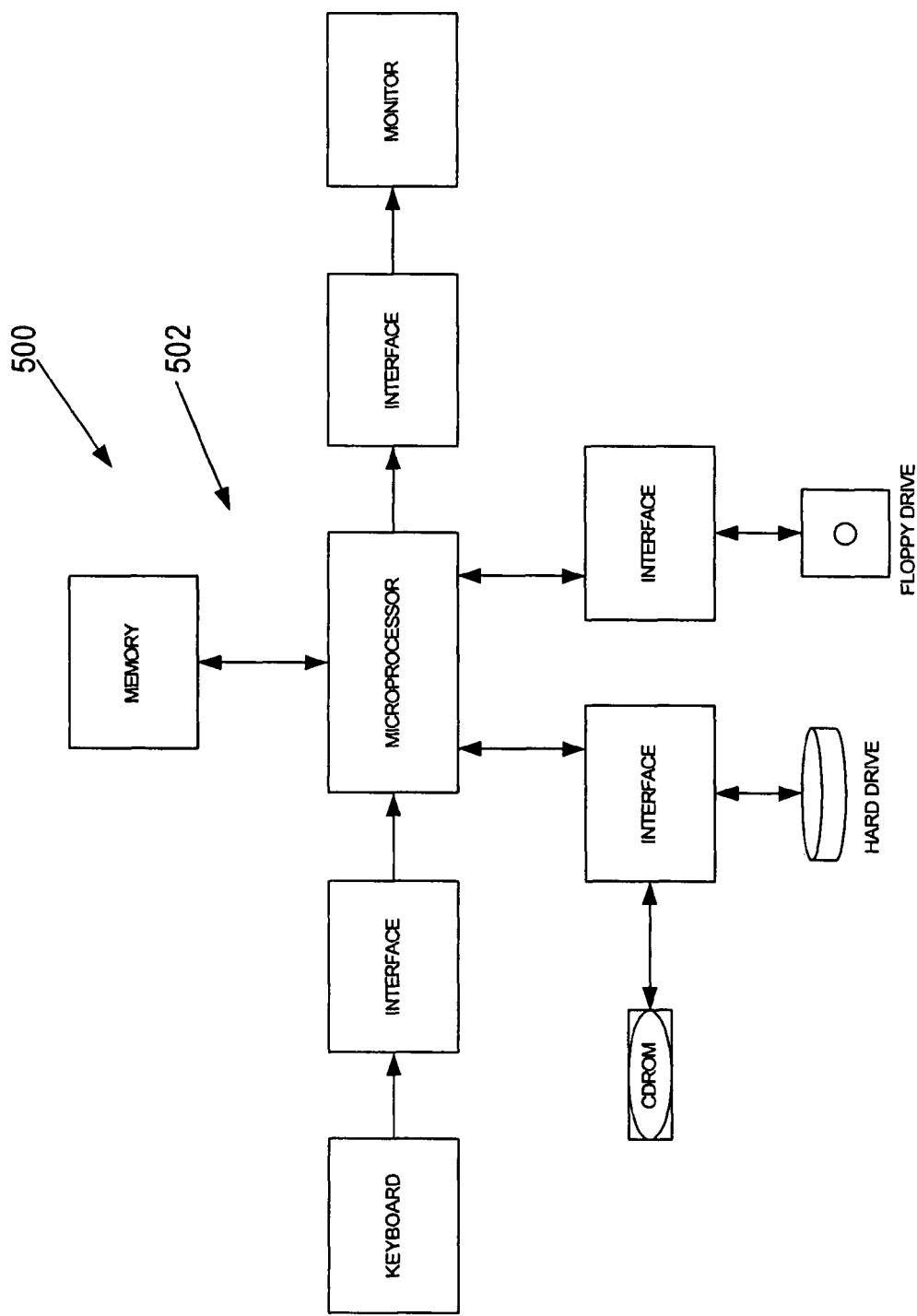

FIG. 35 illustrates yet another system 500 utilizing devices as described above. This system 500 is a computer 502 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The system 300 with advantage uses devices of the type described above.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A metal-insulator-metal (MIM) device comprising:
a first electrode having a layer of oxidation formed therein wherein a top surface of said first electrode and a top surface of said layer of oxidation are coplanar;
an oxide layer formed above the first electrode and on the top surface of the layer of oxidation wherein the oxide layer contacts and covers the entire top surface of the layer of oxidation, contacts and covers the entire top surface of the first electrode and contacts and covers the side surfaces of the first electrode;
a protective layer over the first electrode and having an opening therethrough;
a spacer of insulating material on a wall of the opening in the protective layer;
a second electrode in contact with the oxide layer and spacer; and
a conductive plug that contacts the bottom of the first electrode and the top of a conductive layer.

2. The device of claim 1 wherein the protective layer is on the oxide layer.

3. The device of claim 1 wherein the second electrode extends above the protective layer.

4. The device of claim 1 wherein the device is incorporated in an array.

5. The device of claim 1 and further comprising said device incorporated in a system.

6. The device of claim 5 wherein the system is selected from the group consisting of a hand-held device, a vehicle, and a computer.

7. A memory array comprising:
a plurality of wordlines;
a plurality of bitlines; and
a plurality of memory devices coupled to respective wordlines and bitlines comprising:
a first electrode having a layer of oxidation formed therein wherein a top surface of said first electrode and a top surface of said layer of oxidation are coplanar;
an oxide layer formed above the first electrode and on the top surface of the layer of oxidation wherein the oxide layer contacts and covers the entire top surface of the layer of oxidation, contacts and covers the entire top surface of the first electrode and contacts and covers the side surfaces of the first electrode;
a protective layer over the first electrode and having an opening therethrough;
a spacer of insulating material on a wall of the opening in the protective layer;
a second electrode in contact with the oxide layer and spacer; and
a conductive plug that contacts the bottom of the first electrode and the top of a conductive layer.

8. The memory array of claim 7 wherein the protective layer is on the oxide layer.

9. The memory array of claim 8 wherein the second electrode extends above the protective layer.

10. The memory array of claim 8 and further comprising said array incorporated in a system.

11. The memory array of claim 10 wherein the system is selected from the group consisting of a hand-held device, a vehicle, and a computer.

* * * * *